United States Patent
Yamamori et al.

(10) Patent No.: US 8,039,970 B2
(45) Date of Patent: Oct. 18, 2011

(54) STACKED SEMICONDUCTOR DEVICE AND METHOD OF MANUFACTURING THE SAME

(75) Inventors: Kazuhiro Yamamori, Yokkaichi (JP); Katsuhiro Ishida, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/021,780

(22) Filed: Jan. 29, 2008

(65) Prior Publication Data
US 2008/0179757 A1 Jul. 31, 2008

(30) Foreign Application Priority Data
Jan. 31, 2007 (JP) ................................. 2007-021060

(51) Int. Cl.
*H01L 23/49* (2006.01)
(52) U.S. Cl. .......... 257/777; 257/686; 257/685; 257/723
(58) Field of Classification Search ................ 257/686, 257/777; 438/109
See application file for complete search history.

(56) References Cited

U.S. PATENT DOCUMENTS

| | | | |
|---|---|---|---|
| 6,079,610 A * | 6/2000 | Maeda et al. ............... | 228/180.5 |
| 6,564,449 B1 | 5/2003 | Tsai et al. | |
| 6,683,385 B2 | 1/2004 | Tsai et al. | |
| 6,740,970 B2 | 5/2004 | Hiraoka et al. | |
| 6,933,608 B2 | 8/2005 | Fujisawa | |
| 7,005,577 B2 | 2/2006 | Lee et al. | |
| 7,262,124 B2 | 8/2007 | Fujisawa | |
| 7,298,032 B2 * | 11/2007 | Kim et al. ..................... | 257/686 |
| 2001/0028114 A1 * | 10/2001 | Hosomi ........................ | 257/778 |
| 2002/0125556 A1 * | 9/2002 | Oh et al. ....................... | 257/685 |
| 2004/0155326 A1 * | 8/2004 | Kanbayashi .................. | 257/686 |
| 2004/0201088 A1 | 10/2004 | Kim et al. | |
| 2005/0205981 A1 | 9/2005 | Yoshimura et al. | |
| 2005/0269692 A1 * | 12/2005 | Kwon et al. .................. | 257/723 |

FOREIGN PATENT DOCUMENTS

| | | |
|---|---|---|
| EP | 1 422 014 A1 | 5/2004 |
| JP | 59-224153 | 12/1984 |
| JP | 2-40928 | 2/1990 |
| JP | 4-324946 | 11/1992 |
| JP | 08-088316 | 4/1996 |
| JP | 2002-141459 | 5/2002 |
| JP | 2002-343928 | 11/2002 |
| JP | 2004-172477 | 6/2004 |
| JP | 2004-193363 | 7/2004 |

(Continued)

OTHER PUBLICATIONS

Office Action issued on Jan. 25, 2011 in Japanese Patent Application No. 2007-021060 (with English Translation).

(Continued)

*Primary Examiner* — Wai-Sing Louie
*Assistant Examiner* — Sue Tang
(74) *Attorney, Agent, or Firm* — Oblon, Spivak, McClelland, Maier & Neustadt, L.L.P.

(57) ABSTRACT

A stacked semiconductor device includes a first semiconductor element mounted on a circuit substrate and a second semiconductor element stacked on the first semiconductor element via a spacer layer. An electrode pad of the first semiconductor element is electrically connected to a connection portion of the circuit substrate through a first metal wire. A vicinity of the end portion of the first metal wire connected to the electrode pad is in contact with an insulating protection film which covers the surface of the first semiconductor element.

19 Claims, 6 Drawing Sheets

FOREIGN PATENT DOCUMENTS

| | | |
|---|---|---|
| JP | 2004-228479 | 8/2004 |
| JP | 2004-253693 | 9/2004 |
| JP | 2004-312008 | 11/2004 |
| JP | 2005-116916 | 4/2005 |
| JP | 2005-328005 | 11/2005 |
| JP | 2005328005 A * | 11/2005 |

OTHER PUBLICATIONS

Japanese Office Action issued May 17, 2011, in Patent Application No. 2007-021060 (English-language translation only).

* cited by examiner

STACKED SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-021060 filed on Jan. 31, 2007; the entire contents of which are incorporated herein by reference.

BACKGROUND OF THE INVENTION

1. Field of the Invention

The present invention relates to a stacked semiconductor device and a method of manufacturing the same.

2. Description of the Related Art

To realize miniaturization and high-density packaging of the semiconductor device, a stacked semiconductor device having plural semiconductor elements stacked and sealed in one package has already been put into practical use. In the stacked semiconductor device, the plural semiconductor elements are sequentially stacked on a circuit substrate such as a wiring board and a lead frame via an adhesive layer. The electrode pads of the individual semiconductor element are electrically connected to the connection portions of the circuit substrate through metal wires. Such a laminated body is packaged with a sealing resin to configure the stacked semiconductor device.

The above-described stacked semiconductor device has a possibility that when the semiconductor elements having the same shape are stacked or a semiconductor element having a larger size is stacked on a lower and smaller semiconductor element, the metal wires connected to the lower semiconductor element are contacted to the upper semiconductor element. Therefore, it is important to prevent the occurrence of an insulation failure, a short circuit or the like due to the contact of the metal wires with the upper semiconductor element. Then, a bonding method using the metal wires is improved in various ways to control a loop height of the metal wires connected to the lower semiconductor element to a low level.

Known bonding methods capable of lowering the height of the wire loop include a connecting method (1) which forms a metal bump on an electrode pad of a semiconductor element, performs ball connection of one end of the metal wire to a connection portion of a circuit substrate and pressure-bonds the other end of the metal wire to the metal bump on the electrode pad (a reverse bonding method (see JP-A 2005-328005)), and a connecting method (2) which performs ball connection of one end of a metal wire to an electrode pad of a semiconductor element, squashes the top portion of the ball together with a part of the metal wire, lets out the metal wire, and pressure-bonds the other end of the metal wire to the connection portion of the circuit substrate (see JP-A 2004-172477).

The reverse bonding method (1) can decrease the loop height in comparison with the ordinary bonding (forward bonding), but the conventional method has the height of the metal bump as an obstacle to the further reduction of the height of the wire loop because of the pressure bonding of the metal wire to the metal bump formed on the electrode pad of the semiconductor element. According to the bonding method (2), even if the ball bonded to the electrode pad of the semiconductor element is squashed, the reduction of the height of the ball is limited, and it is difficult to make the loop height of the metal wire lower than, for example, the height of about two times of the wire diameter including the ball-bonded portion.

JP-A 2005-116916 discloses that a metal wire is connected to an electrode pad, which is formed at the vicinity of the center of a semiconductor element, by performing ball connection of one end of the metal wire to the electrode pad, the metal wire is let out in contact with an insulating film (silicon nitride film) of the surface of the semiconductor element so that the metal wire has an M-shaped loop (a loop shape having three bent portions), and the other end of the metal wire is connected to an external terminal by pressure bonding. The simple provision of the metal wire with the M-shaped loop can prevent the contact between the outer circumference of the semiconductor element, but cannot decrease sufficiently the loop height of the metal wire.

SUMMARY OF THE INVENTION

A stacked semiconductor device according to an aspect of the present invention includes: a circuit substrate having an element mounting section and a connection portion; a first semiconductor element, mounted on the element mounting section of the circuit substrate, including a semiconductor element body, a first electrode pad disposed on a surface of the semiconductor element body and an insulating protection film covering the surface while exposing the first electrode pad; a second semiconductor element, stacked on the first semiconductor element via a spacer layer, including a semiconductor element body and a second electrode pad disposed on a surface of the semiconductor element body; a first metal wire which electrically connects the connection portion of the circuit substrate and the first electrode pad of the first semiconductor element, the first metal wire disposing to contact a vicinity of its end portion connected to the first electrode pad with the insulating protection film; and a second metal wire which electrically connects the connection portion of the circuit substrate and the second electrode pad of the second semiconductor element.

A manufacturing method of a stacked semiconductor device according to an aspect of the present invention includes: mounting a first semiconductor element having an electrode pad on an element mounting section of a circuit substrate having a connection portion; forming a metal bump on the electrode pad of the first semiconductor element; connecting a metal ball formed at a first end portion of a metal wire to the connection portion of the circuit substrate by pressure bonding; wiring the metal wire toward the electrode pad of the first semiconductor element; connecting a second end portion of the metal wire to the metal bump formed on the electrode pad while contacting the metal wire to an insulating protection film which is formed to cover a periphery of the electrode pad; and stacking a second semiconductor element on the first semiconductor element via a spacer layer.

A manufacturing method of a stacked semiconductor device according to another aspect of the present invention includes: mounting a first semiconductor element having an electrode pad on an element mounting section of a circuit substrate having a connection portion; connecting a metal ball formed at a first end portion of a metal wire to the electrode pad of the first semiconductor element by pressure bonding; wiring the metal wire toward the connection portion of the circuit substrate while contacting the metal wire to an insulating protection film which is formed to cover a periphery of the electrode pad; connecting a second end portion of the metal wire to the connection portion of the circuit substrate; and stacking a second semiconductor element on the first semiconductor element via a spacer layer.

DETAILED DESCRIPTION OF THE INVENTION

Figure 1:
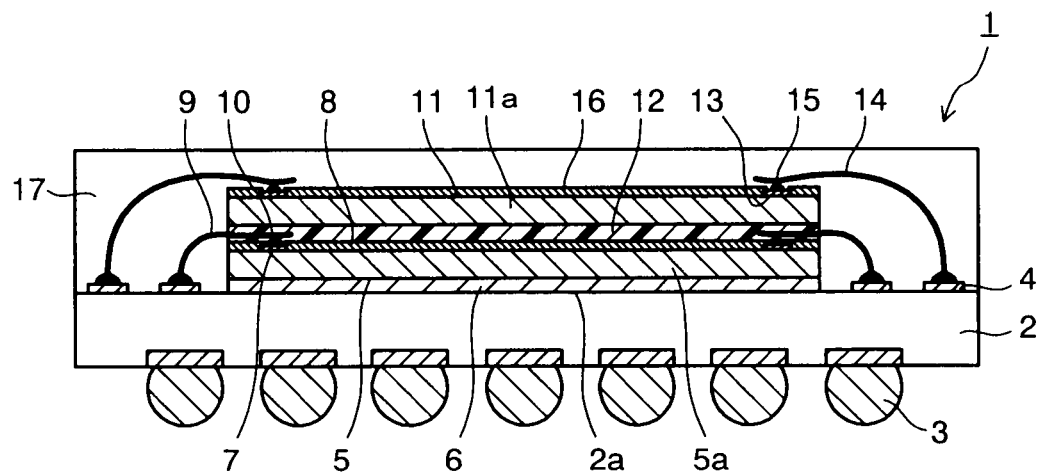
FIG. 1 is a sectional view showing a stacked semiconductor device according to a first embodiment.

Modes of conducting the present invention will be described below with reference to the drawings. FIG. 1 is a sectional view showing the structure of a stacked semiconductor device having a stacked multichip package structure according to a first embodiment of the invention. A stacked semiconductor device 1 shown in FIG. 1 includes a wiring board 2 as an element mounting circuit substrate. The wiring board 2 can mount thereon a semiconductor element and may have a wiring network which is disposed on the surface and interior.

As the substrate configuring the wiring board 2, an insulating substrate such as a resin substrate, a ceramic substrate or a glass substrate, or a semiconductor substrate or the like can be applied. As the wiring board 2 applying the resin substrate, a general multilayer copper-clad laminate (multilayer-printed board) is used. The under surface of the wiring board 2 is provided with external connection terminals 3 such as solder bumps. The top surface of the wiring board 2 is provided with an element mounting section 2a, and connection pads 4 which are electrically connected via the external connection terminals 3 and a wiring network (not shown) are disposed along the periphery of the element mounting section 2a. The connection pads 4 become connection portions when wire bonding.

A first semiconductor element 5 is adhered to the element mounting section 2a of the wiring board 2 via a first adhesive layer 6. For the first adhesive layer 6, a general die-attach film or the like is used. The first semiconductor element 5 has an element body 5a having a circuit including transistors formed and first electrode pads 7 disposed on the surface (top surface) of the element body 5a. The top surface of the first semiconductor element 5 is covered with an insulating protection film 8 which is disposed to expose the first electrode pads 7. For the insulating protection film 8, a passivation layer formed of an $SiO_x$ layer, an $SiN_x$ layer or the like and an insulation resin layer such as a polyimide resin layer which is additionally formed thereon are applied.

The first electrode pads 7 are electrically connected to the connection pads 4 of the wiring board 2 through first metal wires 9 such as Au wires. In FIG. 1, the first metal wires 9 are bonded by reverse bonding. In other words, metal bumps 10 are formed on the first electrode pads 7. One end (first end) of the first metal wire 9 is ball-connected to the connection pad 4 of the wiring board 2, and the other end (second end) is connected to the metal bump 10 formed on the first electrode pad 7. A vicinity of end portion (element-side end) of first metal wire 9 connected to the first electrode pad 7 is in contact with the insulating protection film 8 as described later in detail.

On the first semiconductor element 5, a second semiconductor element 11 is adhered via a second adhesive layer 12. The second semiconductor element 11 has the same shape as the first semiconductor element 5 or a shape which is at least partly larger than the first semiconductor element 5. The second adhesive layer 12 is softened or fused at least partly at the bonding temperature to adhere the first semiconductor element 5 and the second semiconductor element 11 while taking therein the element-side end (connecting-side end portion with the first semiconductor element 5) of the first metal wire 9. An adhesive formed of an insulation resin is used for the second adhesive layer 12 to secure the insulation of the first metal wire 9.

The element-side end of the first metal wire 9 is buried in the second adhesive layer 12 to prevent contact with the second semiconductor element 11. Thus, the second adhesive layer 12 has a function as a spacer layer in addition to the function as an adhesive layer. The spacer layer may be configured of a chip smaller than the semiconductor elements 5, 11. In such a case, the element-side end of the first metal wire 9 is disposed in a space formed by virtue of the spacer layer disposed between the semiconductor elements 5 and 11 and prevented from being contacted with the second semiconductor element 11.

In the stacked semiconductor device 1 shown in FIG. 1, the first metal wire 9 is separated from the under surface of the second semiconductor element 11 based on the thickness (the space between the first semiconductor element 5 and the second semiconductor element 11) of the second adhesive layer 12. To obtain the function as the spacer layer, the thickness of the second adhesive layer 12 is desirably 30 μm or more, and more desirably 50 μm or more. Meanwhile, if the second adhesive layer 12 is excessively thick, the stacked semiconductor device 1 is inhibited from being made thin, so that the thickness of the second adhesive layer 12 is desirably 100 μm or less, and more desirably 80 μm or less.

In order to prevent the contact between the element-side end of the first metal wire 9 and the second semiconductor element 11 more securely, the second adhesive layer 12 may have a first resin layer (adhesive layer) which is softened or fused at the adhering temperature and a second resin layer (insulation layer) which retains the layer shape at the adhering temperature. The element-side end of the first metal wire 9 is taken into the first resin layer, which is disposed on the side of the first semiconductor element 5, and its contact with the second semiconductor element 11 is prevented by the second resin layer which is disposed on the side of the second semiconductor element 11. The first resin layer desirably has a thickness of about 30 to 70 μm. The second resin layer desirably has a thickness of 5 to 15 μm.

Since the first metal wire 9 is disposed in the second adhesive layer 12, it is necessary that the loop height (specifically, the height above the first semiconductor element 5) is made lower than the thickness of the second adhesive layer 12. For example, in a case where the second adhesive layer 12 has a thickness of 60 μm, it is necessary that the first metal wire 9 has a height of 50 μm or less on the first semiconductor element 5. In a case where the adhesive layer 12 having a two-layer structure is applied, it is necessary that the first metal wire 9 has a height of 50 μm or less because the second resin layer (insulation layer) has a thickness of about 10 μm.

To realize the height of the first metal wire 9 described above, the first embodiment applies reverse bonding for connection of the first metal wire 9, and contacting the vicinity of the element-side end of the first metal wire 9 to the insulating protection film 8. The loop height is decreased by applying the reverse bonding, and the first metal wire 9 is contacted to the insulating protection film 8 to perform wiring. Thus, it possible to decrease the height of the first metal wire 9 on the first semiconductor element 5 satisfactorily. For example, where the Au wire having a diameter of 25 μm is applied, the height of the first metal wire 9 on the first semiconductor element 5 can be decreased to 50 μm or less, and also to a value close to the diameter of the metal wire 9.

The second semiconductor element 11 adhered to the first semiconductor element 5 has second electrode pads 13 disposed on a surface (top surface) of an element body 11a. The second electrode pads 13 are electrically connected to the connection pads 4 of the wiring board 2 through second metal wires 14 to which the reverse bonding is applied. Metal bumps 15 are formed on the second electrode pads 13, and one ends of the second metal wires 14 are connected to the metal bumps 15. The surface of the second semiconductor element 11 is covered with an insulating protection film 16 in the same manner as the first semiconductor element 5.

The first and second semiconductor elements 5, 11 stacked on the wiring board 2 are sealed with a sealing resin 17 such as an epoxy resin to configure the stacked semiconductor device 1 having a stacked multichip package structure. In FIG. 1, the structure that the two semiconductor elements 5, 11 were stacked was described, but the number of stacked semiconductor elements is not limited to the above. The number of stacked semiconductor elements may be three or more.

Figure 2:
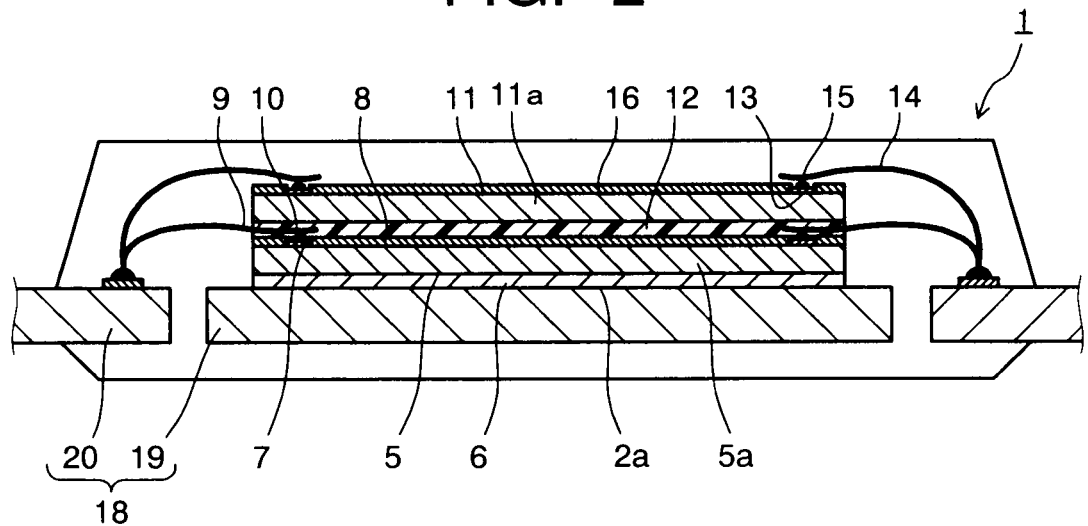
FIG. 2 is a sectional view showing a modified example of the stacked semiconductor device shown in FIG. 1.

FIG. 1 shows a structure that the first and second semiconductor elements 5, 11 are stacked on the wiring board 2, but the structure of the stacked semiconductor device 1 of the first embodiment is not limited to the above. The stacked semiconductor device 1 of the first embodiment may be a semiconductor package (such as TSOP) which has the first and second semiconductor elements 5, 11 stacked sequentially on a lead frame 18 as shown in FIG. 2. The number of stacked semiconductor elements may be three or more.

The stacked semiconductor device 1 having the TSOP structure shown in FIG. 2 has the lead frame 18 as an element-mounting circuit substrate. The lead frame 18 has an element-mounting section 19 and lead portions 20. The lead portions 20 serve as connection portions (inner lead portions) electrically connected to the first and second semiconductor elements 5, 11, which are stacked on the element-mounting section 19, and external connection terminals (outer lead portions).

The first semiconductor element 5 and the second semiconductor element 11 are sequentially adhered onto the element mounting section 19 of the lead frame 18 via the first and second adhesive layers 6, 12. The electrode pads 7, 13 of the first and second semiconductor elements 5, 11 and the lead portion 20 of the lead frame 18 are electrically connected through the metal wires 9, 14. The connected structure (a bonding method, a mode of the element-side end, etc.) of the metal wires 9, 14 is determined to be same as that of the stacked semiconductor device 1 shown in FIG. 1. Besides, the function, structure, shape and the like of the second adhesive layer 12 are also same as those of the stacked semiconductor device 1 shown in FIG. 1.

A connecting step of the first metal wire 9 of the stacked semiconductor device 1 of the first embodiment is described in detail with reference to FIG. 3 through FIG. 8. First, the metal bump 10 is formed on the first electrode pad 7 before the connecting step of the first metal wire 9. Specifically, a metal ball (such as an Au ball) formed at a leading end of a metal wire such as an Au wire is press-contacted to the electrode pad 7, and a load and ultrasonic oscillation are applied to the metal ball to bond (pressure-bond) to the electrode pad 7.

Figure 3:
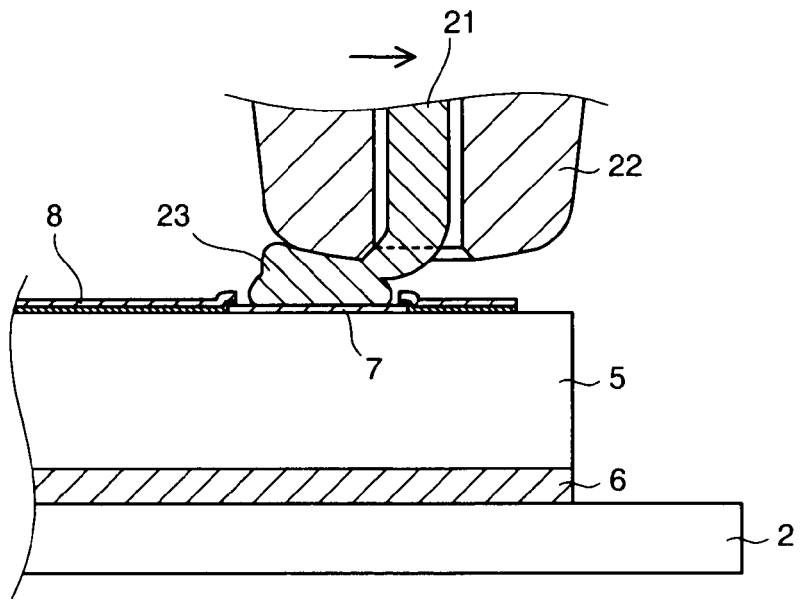
FIG. 3 is a sectional view showing a step of forming a metal bump on a first electrode pad in a manufacturing process of the stacked semiconductor device shown in FIG. 1.

At this time, it is desirable that a bonding tool (capillary) 22, which supports a metal wire 21, is moved in a direction (a direction toward a feeding direction of the metal wire viewed from the electrode pad 7) toward an end portion (an end located below the metal wire) of the semiconductor element 5 as shown in FIG. 3 to squash a metal ball 23 which is bonded to the electrode pad 7. The metal ball 23 is squashed to incline toward the wire feeding direction. The step of squashing the metal ball 23 may be performed by raising once the bonding tool 22 which has pressure-bonded the metal ball 23 to the electrode pad 7, moving the bonding tool 22 in that state toward the end portion of the semiconductor element 5, and lowering the bonding tool 22 to re-press the metal ball 23.

The height of the metal ball 23 bonded to the electrode pad 7 can be decreased by squashing the metal ball 23 by the bonding tool 22. The height of the first metal wire 9 on the first semiconductor element 5 can be lowered furthermore by decreasing the height of the metal ball 23. Besides, the connected height of the first metal wire 9 can be lowered furthermore by squashing the metal ball 23 to incline toward the wire feeding direction. Then, the bonding tool 22 is pulled up to cut off the metal wire 21 so as to form the metal bump 10 on the electrode pad 7. The metal bump 10 has a squashed shape to incline toward the end portion (end portion located below the metal wire) of the semiconductor element 5 through the step of squashing the metal ball 23.

Figure 4:
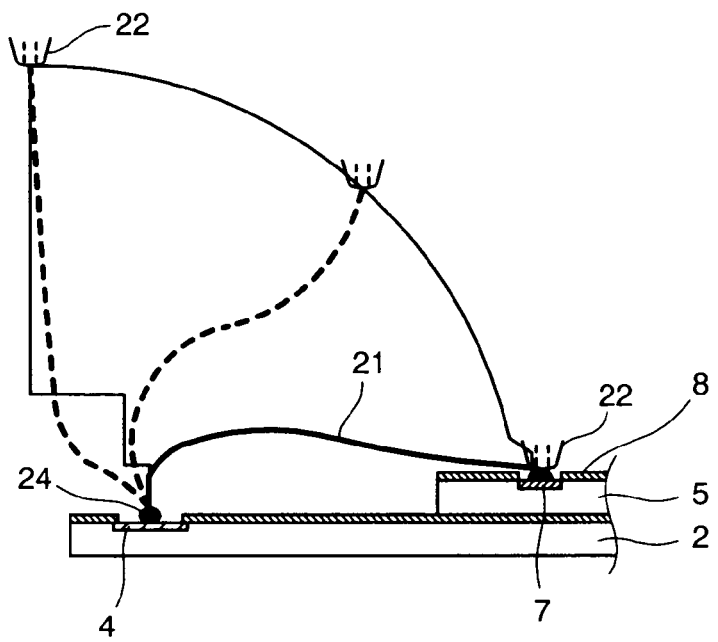
FIG. 4 is a diagram showing a connecting step including a wiring operation of a first metal wire in the manufacturing process of the stacked semiconductor device shown in FIG. 1.

As shown in FIG. 4, a metal ball (such as an Au ball) 24 is then formed at a leading end (first end) of the wire bonding metal wire (such as an Au wire) 21 and connected (ball-connected) to the connection pad 4 of the wiring board 2. The ball connection step is performed by applying a load and ultrasonic oscillation in the same manner as the ordinary wire bonding. Subsequently, the bonding tool 22 is moved to the above of the metal bump 10 which is formed on the electrode pad 7 while wiring by letting out the metal wire 21 from the bonding tool 22.

Figure 5:
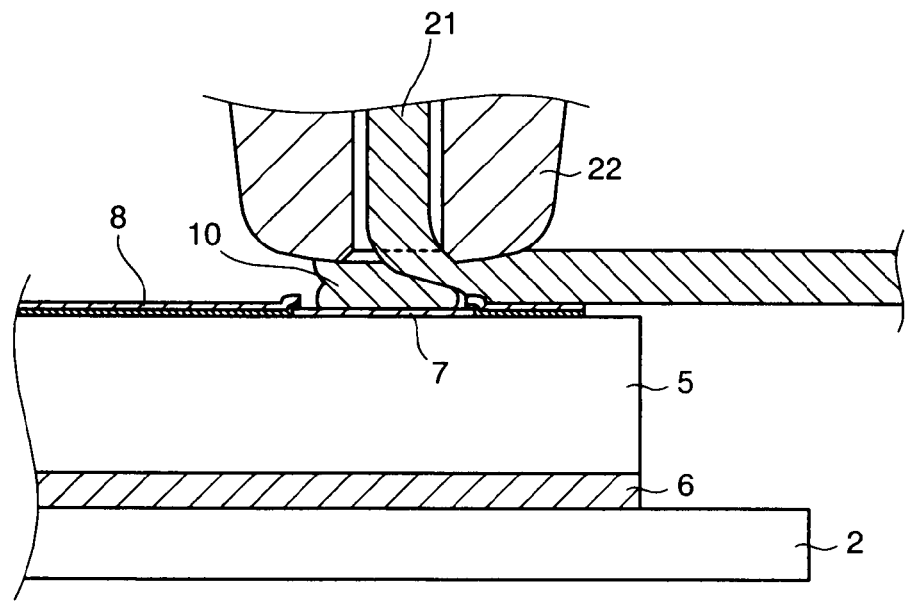
FIG. 5 is a sectional view showing a step of connecting the first metal wire to the metal bump in the manufacturing process of the stacked semiconductor device shown in FIG. 1.

At that time, the bonding tool 22 is pitched downward onto the insulating protection film 8 to connect (stitch-bond) to the metal bump 10 while the metal wire 21 is in contact with the insulating protection film 8 which is disposed on the periphery of the electrode pad 7 as shown in FIG. 5. The metal wire 21 is contacted onto the insulating protection film 8 located in a wire feeding direction when viewed from the metal bump 10 and connected to the metal bump 10 continuously from the portion contacted to the insulating protection film 8. The stitch bonding is performed by applying a load and ultrasonic oscillation in the same manner as the ordinary wire bonding.

If the metal wire 21 is simply connected to the metal bump 10, the height of the metal wire 21 on the semiconductor element 5 cannot be made lower than the connection height based on the height of the metal bump 10 and also the height based on the loop shape of the metal wire 21 at the time of connecting to the metal bump 10. Accordingly, in the first embodiment, the metal wire 21 is connected to the metal bump 10 while it is kept contacted to the insulating protection film 8. In other words, the vicinity of the connection portion between the metal wire 21 and the electrode pad 7 (specifically, the metal bump 10) is in contact with the insulating protection film 8 located in the wire feeding direction when viewed from the connection portion (the electrode pad 7).

Thus, it becomes possible to lower the height of the metal wire 21 on the semiconductor element 5 by contacting the metal wire 21 to the insulating protection film 8. Besides, the metal wire 21 is contacted onto the insulating protection film 8, which is located in the wire feeding direction when viewed from the electrode pad 7, and connected to the electrode pad 7 continuously from the contact portion. Thus, the height of the metal wire 21 on the semiconductor element 5 can be lower. Specifically, the height of the metal wire 21 on the semiconductor element 5 can be lowered to a value close to the diameter of the metal wire 21 excepting the height of the connection portion between the metal wire 21 and the metal bump 10.

Figure 6:
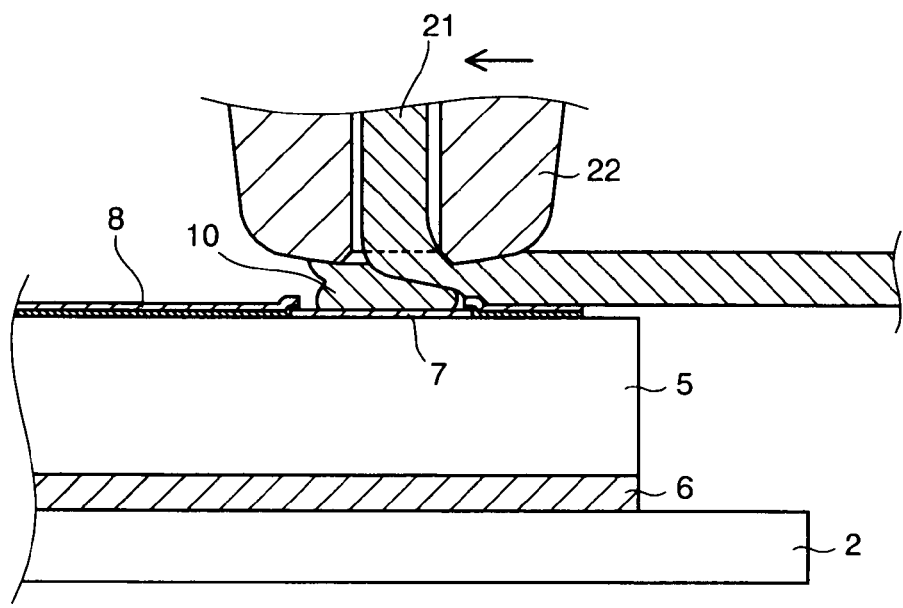
FIG. 6 is a sectional view showing a modified example of the step of connecting the first metal wire shown in FIG. 5.

The connection height of the metal wire 21 on the metal bump 10 can be made lower by performing the squashing operation of the metal bump 10 shown in FIG. 6 in addition to the squashing operation in the bonding process of the metal ball 23 shown in FIG. 3. In other words, after the metal wire 21 is connected to the metal bump 10, the bonding tool 22 is moved horizontally in a direction (the center direction of the semiconductor element 5) opposite to the wire feeding direction to further squash the metal bump 10. The connection height with the metal bump 10 can be made lower furthermore. The metal bump 10 is also made to have a squashed shape which is inclined toward (toward the wire feeding direction) the end portion of the semiconductor element 5 by the squashing step after the connection of the metal wire 21.

Figure 7:
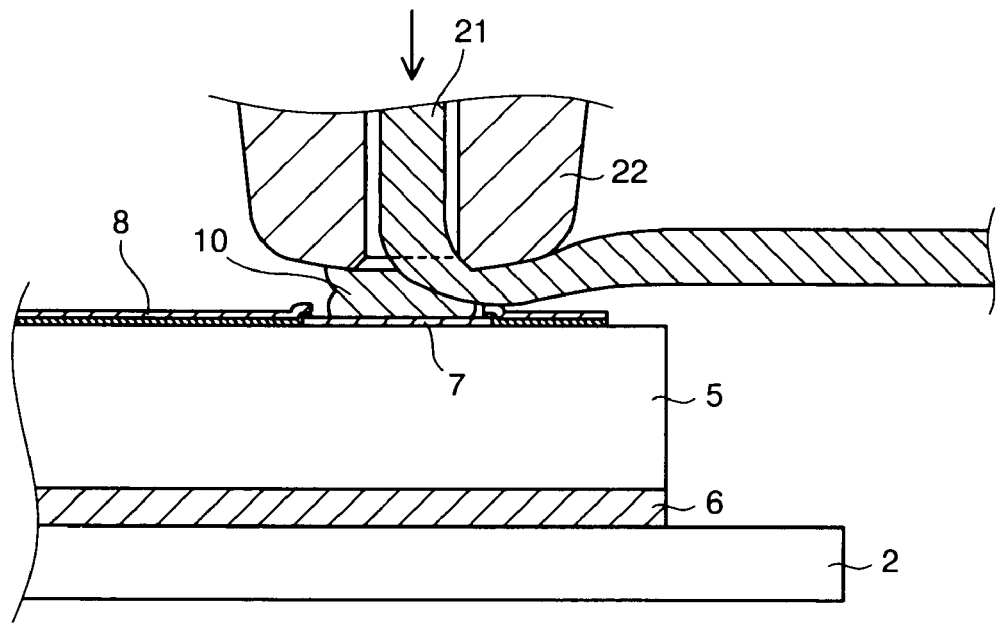
FIG. 7 is a sectional view showing a connecting operation of the metal wire to the metal bump according to another modified example of the step of connecting the first metal wire shown in FIG. 5.
Figure 8:
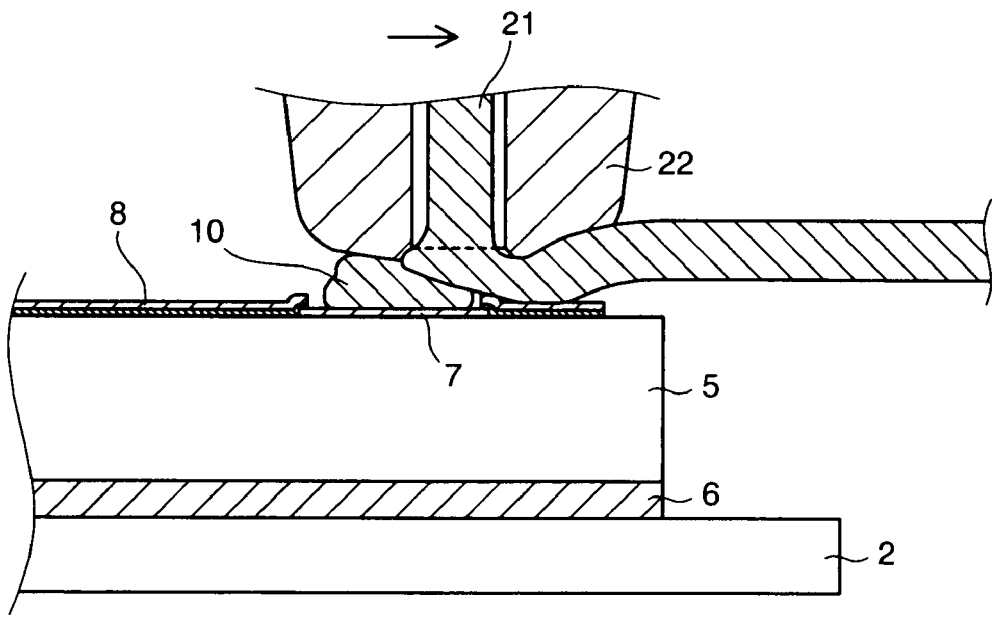
FIG. 8 is a sectional view showing a contacting operation of the metal wire to an insulating protection film according to another modified example of the step of connecting the first metal wire shown in FIG. 5.

The contacting operation of the metal wire 21 to the insulating protection film 8 may be performed after the metal wire 21 is connected to the metal bump 10 as shown in FIG. 7 and FIG. 8. First, the wired metal wire 21 is connected to the metal bump 10 as shown in FIG. 7. Then, the bonding tool 22 is moved horizontally in the wire feeding direction as shown in FIG. 8 to press the metal wire 21 to contact to the insulating protection film 8. Thus, the metal wire 21 can be contacted to the insulating protection film 8, and it becomes possible to lower the height of the metal wire 21. The same is also applied to the connection height with respect to the metal bump 10.

After the connecting step (including the contacting step to the insulating protection film 8) of the metal wire 21 to the metal bump 10 is performed, the bonding tool 22 is pulled up to cut off the metal wire 21. After the metal wire 21 is cut off, the end portion (second end portion) is in connection with the metal bump 10 in a state continuous from the portion contacted to the insulating protection film 8. The first metal wire 9 is formed to electrically connect the first electrode pad 7 of the first semiconductor element 5 and the connection pad 4 of the wiring board 2. The application of the connecting step for the metal wire 21 enables to obtain the first metal wire 9 with its height on the first semiconductor element 5 lowered satisfactorily with a good reproducibility. The first metal wire 9 does not come into contact with the end portion (edge) of the first semiconductor element 5 by the wiring of the metal wire 21.

According to the first embodiment, the height of the first metal wire 9 on the first semiconductor element 5 can be lowered satisfactorily. Thus, the element-side end of the first metal wire 9 can be finely buried into the second adhesive layer 12 which adheres while keeping small the gap between the first semiconductor element 5 and the second semiconductor element 11. In other words, the occurrence of an insulation failure or a short circuit because of the contact between the first metal wire 9 buried into the second adhesive layer 12 and the second semiconductor element 11 can be prevented, and the occurrence of a connection failure which might be caused when the connection portion between the first metal wire 9 and the first electrode pad 7 is deformed excessively when the second semiconductor element 11 is adhered can be suppressed.

Thus, the stacked semiconductor device 1 which is made thin by reducing the gap between the first semiconductor element 5 and the second semiconductor element 11 can be provided with a good reproducibility while the occurrence of an insulation failure or a short circuit because of the contact between the first metal wire 9 and the second semiconductor element 11 and the occurrence of a connection failure due to excessive deformation of the first metal wire 9 are prevented. In other words, the production yield, reliability and the like of the thin stacked semiconductor device 1 can be enhanced.

Figure 9:
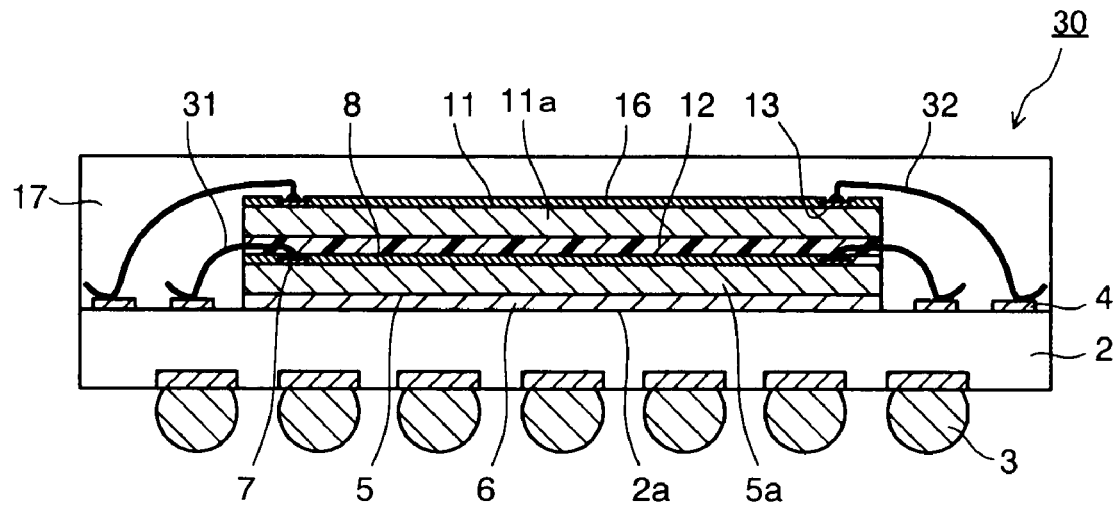
FIG. 9 is a sectional view showing a stacked semiconductor device according to a second embodiment.

Then, the stacked semiconductor device according to a second embodiment of the invention is described with reference to FIG. 9. FIG. 9 is a sectional view showing a structure of the stacked semiconductor device having a stacked multichip package structure of the second embodiment of the invention. A stacked semiconductor device 30 shown in FIG. 9 has the electrode pads 7, 13 of the first and second semiconductor elements 5, 11 and the connection pads 4 of the wiring board 2 electrically connected through metal wires 31, 32 by forward bonding. The other structure is determined to be same as that of the first embodiment.

The first metal wire 31 which connects the first electrode pad 7 of the first semiconductor element 5 and the connection pad 4 of the wiring board 2 has its one end (first end) ball-connected to the first electrode pad 7 and the other end (second end) stitch-bonded to the connection pad 4. The vicinity of end portion (element-side end) of the first metal wire 31 connected to the first electrode pad 7 is in contacted with the insulating protection film 8. The second metal wire 32, which connects the second electrode pad 13 of the second semiconductor element 11 and the connection pad 4 of the wiring board 2, also has its one end ball-connected to the second electrode pad 13 and the other end stitch-bonded to the connection pad 4.

In the second embodiment, the first metal wire 31 which is ball-connected to the first electrode pad 7 is contacted to the insulating protection film 8 to reduce the height of the first metal wire 9 on the first semiconductor element 5. Thus, even when the forward bonding is applied to the connecting step for the first metal wire 31, the height of the first metal wire 9 can be reduced by contacting the vicinity of the element-side end of the first metal wire 31 to the insulating protection film 8. Thus, the stacked semiconductor device 30 can be made thin and the integrity and reliability of the connected portion of the first metal wire 31 can also be improved.

Similar to the stacked semiconductor device 1 of the first embodiment, the stacked semiconductor device 30 of the second embodiment may also be a semiconductor package (such as TSOP) which has the first and second semiconductor elements stacked sequentially on the lead frame. The specific structure of such a case is as shown in FIG. 2. The number of stacked semiconductor elements may be three or more.

Then, a forming step (connecting step for the metal wire) for the first metal wire 31 of the stacked semiconductor device 30 of the second embodiment is described in detail with reference to FIG. 10 through FIG. 12. First, a metal ball (such as an Au ball) is formed at a leading end (first end) of the metal wire (such as an Au wire) for wire bonding and connected (ball-connected) to the first electrode pad 7 of the first semiconductor element 5. The connecting step for the metal ball is performed by applying a load and ultrasonic oscillation in the same manner as the ordinary wire bonding.

Figure 10:
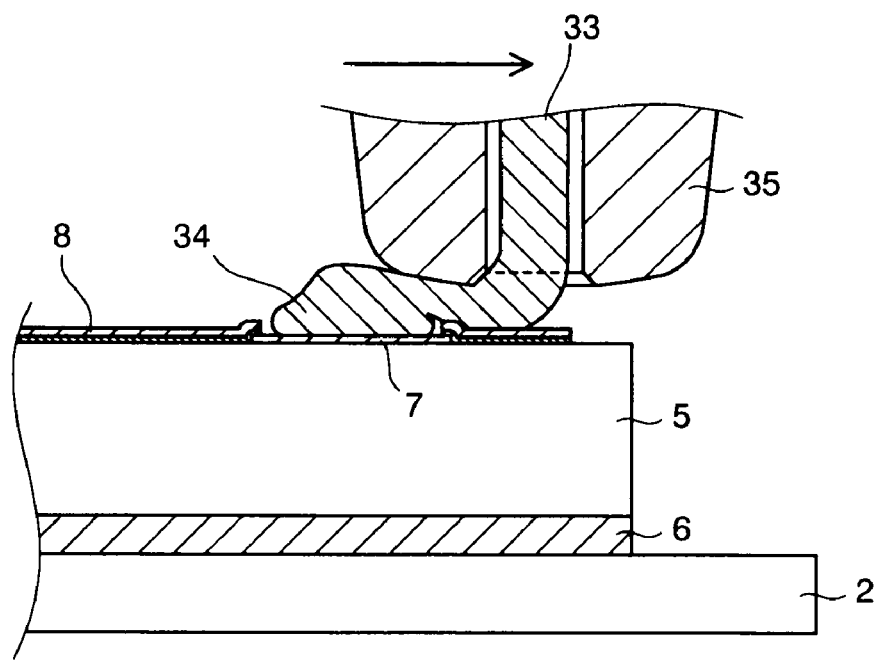
FIG. 10 is a sectional view showing a step of ball connection of the first metal wire onto a first electrode pad in a manufacturing process of the stacked semiconductor device shown in FIG. 9.

As shown in FIG. 10, after a metal ball 34 which is formed at a leading end of a metal wire 33 is connected to the electrode pad 7, a bonding tool (capillary) 35 which supports the metal wire 33 is lowered and also moved in a direction of the end portion of the semiconductor element 5 (a wiring direction of the metal wire 33/a direction toward the connection pad 4 of the wiring board 2) to contact the metal wire 33 with the insulating protection film 8 which is disposed on the periphery of the electrode pad 7. The metal wire 33 is contacted to the insulating protection film 8 continuously from the portion connected to the electrode pad 7. Thus, the height of the metal wire 33 on the semiconductor element 5 applying forward bonding can be lowered.

Figure 11:
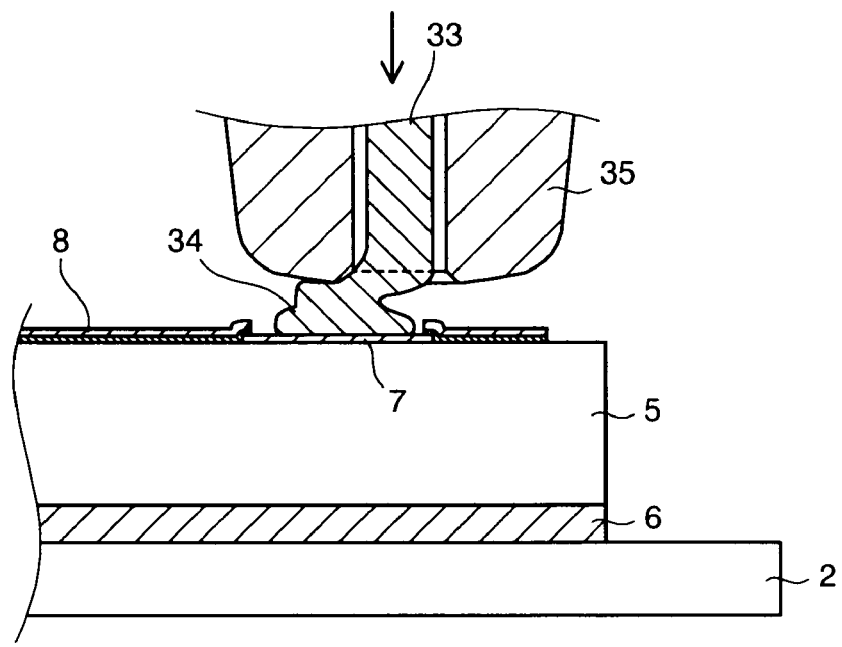
FIG. 11 is a sectional view showing a metal ball connecting operation in a modified example of the step of ball connection of the first metal wire shown in FIG. 10.
Figure 12:
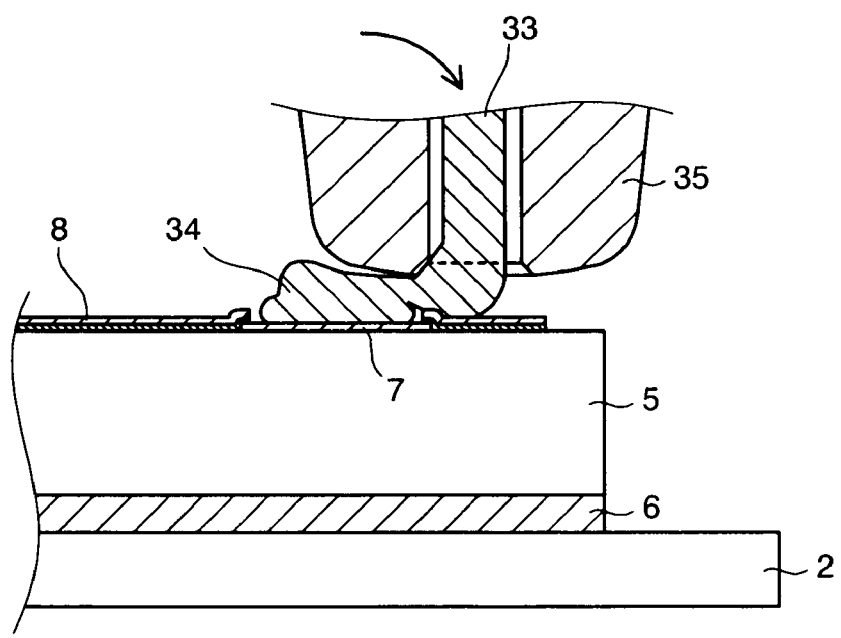
FIG. 12 is a sectional view showing the contacting operation of the metal wire to an insulating protection film in the modified example of the step of ball connection of the first metal wire shown in FIG. 10.

The operation of contacting the metal wire 33 to the insulating protection film 8 may be performed together with the metal ball squashing operation as shown in FIG. 11 and FIG. 12. In other words, the metal ball 34 formed at the leasing end of the metal wire 33 is connected to the electrode pad 7 by pressure bonding as shown in FIG. 11, the bonding tool 35 is pressed against the vicinity of the top of the metal ball 34, and the metal ball 34 is squashed together with a part of the metal wire 33 to lower the connection height.

Then, as shown in FIG. 12, the bonding tool 35 is lowered and also moved in a direction (wiring direction of the metal wire 33) of the end of the semiconductor element 5 to contact the metal wire 33 to the insulating protection film 8 which is disposed on the periphery of the electrode pad 7. The connection portion between the metal wire 33 and the electrode pad 7 is squashed, and the squashed portion is continuously contacted to the insulating protection film 8. The above operation can be applied to make it possible to lower the connection height of the metal ball 34 and the height of the metal wire 33 on the semiconductor element 5.

After the above-described step (including the contacting step of the metal wire 33 to the insulating protection film 8) of connecting the metal ball 34 to the electrode pad 7 is performed, the metal wire 33 is let out from the bonding tool 35 to perform wiring, and the bonding tool 35 is simultaneously moved onto the connection pad 4 of the wiring board 2. After the metal wire 33 is stitch-bonded to the connection pad 4, the bonding tool 35 is pulled up to cut off the metal wire 33. Thus, the first metal wire 31 is formed to electrically connect the first electrode pad 7 and the connection pad 4.

The height of the first metal wire 31 on the first semiconductor element 5 can also be lowered in the second embodiment. Thus, the element-side end of the first metal wire 31 can be finely buried into the second adhesive layer 12 which adheres while keeping small the gap between the first semiconductor element 5 and the second semiconductor element 11. In other words, the occurrence of an insulation failure or a short circuit because of the contact of the first metal wire 31 buried into the second adhesive layer 12 with the second semiconductor element 11 can be prevented, or the occurrence of a connection failure which might be caused when the connection portion between the first metal wire 31 and the first electrode pad 7 is deformed excessively when the second semiconductor element 11 is adhered can be suppressed.

Therefore, the stacked semiconductor device 30 which is made thin by reducing the gap between the first and second semiconductor elements 5, 11 can be provided while the occurrence of an insulation failure or a short circuit because of the contact between the first metal wire 31 and the second semiconductor element 11 and the occurrence of a connection failure due to excessive deformation of the first metal wire 31 are prevented. In other words, the production yield, reliability and the like of the thin stacked semiconductor device 30 can be enhanced. For lowering of the height of the first metal wire, the first embodiment applying the reverse bonding is more effective.

The present invention is not limited to the above-described embodiments but can be applied to the stacked semiconductor devices having various types of structures that the plural semiconductor elements are stacked on the circuit substrate and the wire bonding is applied for connection of the circuit substrate and the semiconductor element. Such a stacked semiconductor device and a method of manufacturing it are also included in the present invention. The embodiments of the invention can be expanded or modified within the scope of technical idea of the invention, and the expanded and modified embodiments are also included in the technical scope of the invention.

What is claimed is:
1. A stacked semiconductor device, comprising:
a circuit substrate having an element mounting section and a connection portion;
a first semiconductor element, mounted on the element mounting section of the circuit substrate, including a first semiconductor element body having a circuit with a transistor, a first electrode pad disposed on a surface of the first semiconductor element body, a metal bump formed on the first electrode pad and an insulating protection film formed on the surface of the first semiconductor element body, on which the first electrode pad is disposed, to cover the surface containing a periphery of the first electrode pad while exposing the first electrode pad;
a second semiconductor element, stacked on the first semiconductor element so as to cover the first electrode pad, including a second semiconductor element body and a second electrode pad disposed on a surface of the second semiconductor element body, the second semiconductor element being disposed on the first semiconductor element via a spacer layer; and
a first metal wire electrically connecting the connection portion of the circuit substrate and the first electrode pad of the first semiconductor element,
wherein a first end portion of the first metal wire is ball-connected to the connection portion of the circuit substrate, a second end portion of the first metal wire is connected to the metal bump formed on the first electrode pad, and the first metal wire is in contact with the insulating protection film located around the first electrode pad on the surface of the first semiconductor element body.

2. The device according to claim 1,
wherein the spacer layer includes an insulating adhesive layer, and the second end portion of the first metal wire is buried in the insulating adhesive layer.

3. The device according to claim 1,
wherein the second end portion of the first metal wire is connected to the metal bump continuously from a portion contacted to the insulating protection film.

4. The device according to claim 1,
wherein the metal bump is squashed to incline toward an end of the first semiconductor element which is positioned below the first metal wire, and the second end portion of the first metal wire is connected to an inclined portion of the metal bump.

5. The device according to claim 4,
wherein the first metal wire is wired to connect the second end portion to the inclined potion of the metal bump while contacting with the insulating protection film.

6. The device according to claim 1,
wherein the circuit substrate is provided with a wiring board which has a connection pad as the connection portion.

7. The device according to claim 1,
wherein the circuit substrate is provided with a lead frame which has a lead portion as the connection portion.

8. The device according to claim 1, further comprising:
a second metal wire electrically connecting the connection portion of the circuit substrate and the second electrode pad of the second semiconductor element.

9. The device according to claim 1,
wherein the metal bump is squashed to incline toward an end of the first semiconductor element which is positioned below the first metal wire, and the second end portion of the first metal wire is connected to an inclined portion of the metal bump continuously from a portion in contact with the insulating protection film, and
wherein the spacer layer includes an insulating adhesive layer, and the second end portion of the first metal wire is buried in the insulating adhesive layer.

10. The device according to claim 9,
wherein the circuit substrate is provided with a wiring board which has a connection pad as the connection portion.

11. The device according to claim 9,
wherein the circuit substrate is provided with a lead frame which has a lead portion as the connection portion.

12. A stacked semiconductor device, comprising:
a circuit substrate having an element mounting section and a connection portion;
a first semiconductor element, mounted on the element mounting section of the circuit substrate, including a first semiconductor element body having a circuit with a transistor, a first electrode pad disposed on a surface of the first semiconductor element body and an insulating protection film formed on the surface of the first semiconductor element body, on which the first electrode pad is disposed, to cover the surface containing a periphery of the first electrode pad while exposing the first electrode pad;
a second semiconductor element, stacked on the first semiconductor element so as to cover the first electrode pad, including a second semiconductor element body and a second electrode pad disposed on a surface of the second semiconductor element body, the second semiconductor element being disposed on the first semiconductor element via a spacer layer; and
a first metal wire electrically connecting the connection portion of the circuit substrate and the first electrode pad of the first semiconductor element,
wherein a first end portion of the first metal wire is ball-connected to the first electrode pad of the first semiconductor element, a second end portion of the first metal wire is connected to the connection portion of the circuit substrate, and the first metal wire is in contact with the insulating protection film located around the first electrode pad on the surface of the first semiconductor element body.

13. The device according to claim 12,
wherein the spacer layer includes an insulating adhesive layer, and the first end portion of the first metal wire is buried in the insulating adhesive layer.

14. The device according to claim 12,
wherein the first metal wire is wired to contact with the insulating protection film continuously from the first end portion.

15. The device according to claim 12,
wherein the first end portion of the first metal wire is squashed, and the first metal wire is wired to contact with the insulating protection film continuously from the squashed portion.

16. The device according to claim 12, further comprising:
a second metal wire electrically connecting the connection portion of the circuit substrate and the second electrode pad of the second semiconductor element.

17. The device according to claim 12,
wherein the first end portion of the first metal wire is squashed, and the first metal wire is wired to contact with the insulating protection film continuously from the squashed portion, and
wherein the spacer layer includes an insulating adhesive layer, and the first end portion of the first metal wire is buried in the insulating adhesive layer.

18. The device according to claim 17,
wherein the circuit substrate is provided with a wiring board which as a connection pad as the connection portion.

19. The device according to claim 17,
wherein the circuit substrate is provided with a lead frame which has a lead portion as the connection portion.

* * * * *